United States Patent [19]
Petty et al.

[11] Patent Number: 5,471,174
[45] Date of Patent: Nov. 28, 1995

[54] AMPLIFIER HAVING AN OUTPUT STAGE WITH BIAS CURRENT CANCELLATION

[75] Inventors: Thomas D. Petty, Tempe; Troy L. Stockstad, Phoenix; Robert L. Vyne, Tempe, all of Ariz.

[73] Assignee: Motorola, Inc., Schaumburg, Ill.

[21] Appl. No.: 349,578

[22] Filed: Dec. 5, 1994

[51] Int. Cl.⁶ ........................................ H03F 3/45
[52] U.S. Cl. .................... 330/257; 330/261; 330/286; 330/296
[58] Field of Search ...................... 330/257, 261, 330/288, 296; 323/315–317

[56] References Cited

U.S. PATENT DOCUMENTS 5,406,222  4/1995  Brokaw .................... 330/261 X

FOREIGN PATENT DOCUMENTS 17712   1/1984   Japan ............................ 330/261
278108 11/1989   Japan ............................ 330/257

*Primary Examiner*—James B. Mullins
*Attorney, Agent, or Firm*—Robert D. Atkins

[57] ABSTRACT

An amplifier circuit (10) receives a differential input signal and provides an amplified differential signal. A converter circuit (14) is responsive to the amplified differential signal and provides a single-ended signal. An output stage (16) is responsive to the single-ended signal for providing an output signal of the amplifier circuit. The output stage provides bias cancellation for the single-ended signal by injecting a current equal to the bias requirement of the input transistors (20, 38). The bias cancellation maintains a high input impedance and high gain and output drive for the output stage.

17 Claims, 2 Drawing Sheets

5,471,174

AMPLIFIER HAVING AN OUTPUT STAGE WITH BIAS CURRENT CANCELLATION

BACKGROUND OF THE INVENTION

The present invention relates in general to amplifier circuits and, more particularly, to an output stage of an amplifier.

Differential amplifier circuits are used in a myriad of applications to amplify differential signals and provide a single-ended output signal. For example, in U.S. Pat. No. 5,153,529, the differential input signal is applied to a conventional differential transistor pair. A differential to single-ended converter converts the differential signal to single-ended operation. The single-ended signal is processed through an output stage that provides additional gain and output drive.

The amplifier circuit requires one or more power supply potentials for operation. The modern trend is to lower the operating potential to the amplifier, especially for battery-supplied applications such as cellular telephones, digital pagers and portable computers. The lower operating potential is desirable as it requires fewer serially coupled battery cells to supply the operating potential to the end use circuit.

The input impedance looking into the output stage should be kept as high as possible to provide maximum gain and drive capacity for the amplifier. In the prior art, transistors are often cascoded between the input of the output stage and the power supply conductor to provide the high impedance at that node. Unfortunately, a low power supply operating potential of say 1.0 volts does not allow sufficient headroom for cascoded transistors to provide the high input impedance.

Hence, a need exists to maintain high impedance into the output stage with a low power supply potential to the amplifier.

DETAILED DESCRIPTION OF THE PREFERRED EMBODIMENT

Figure 1:
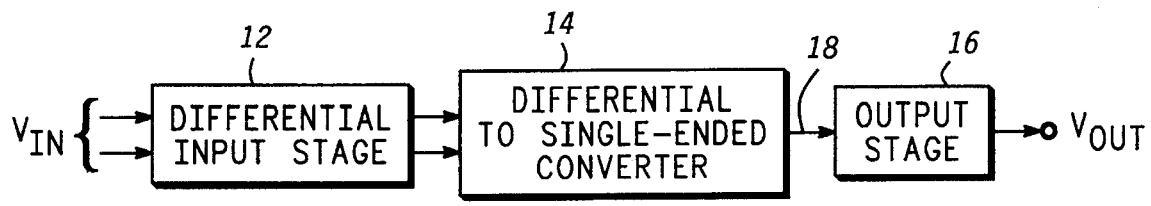
FIG. 1 is block diagram of a differential to single-ended amplifier.
Figure 1:

Referring to FIG. 1, a differential to single-ended amplifier circuit 10 is shown suitable for manufacturing as an integrated circuit using conventional integrated circuit processes. A differential input stage 12 receives a differential input signal $V_{IN}$ and provides amplification. The amplified differential signal is converted to single-ended form by differential to single-ended converter 14. An embodiment of the differential input stage and converter is disclosed in U.S. Pat. No. 5,153,529, and in U.S. patent application No. 08/264,290, now U.S. Pat. No. 5,422,600, and is hereby incorporated by reference. The single-ended output signal from converter 14 at node 18 is processed through amplifier output stage 16 for providing an output signal $V_{OUT}$ having high gain and drive capacity. It is important to maintain high input impedance looking into output stage 16 at node 18 in order to provide maximum gain and output drive.

Figure 2:
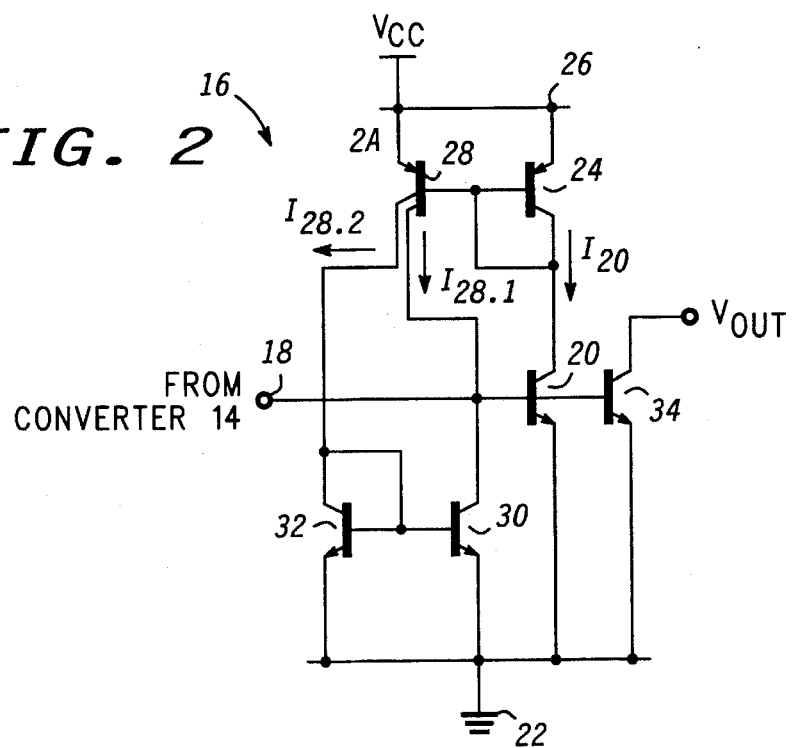
FIG. 2 is a schematic diagram illustrating an output stage of the amplifier.

As part of the present invention, output stage 16 is shown in further detail in FIG. 2 including transistor 20 having a base coupled to node 18 for receiving the single-ended signal from converter 14. The emitter of transistor 20 is coupled to power supply conductor 22 operating at ground potential. The collector of transistor 20 is coupled to the base and collector of diode-configured transistor 24. The emitter of transistor 24 is coupled to power supply conductor 26 operating at positive power supply potential $V_{CC}$ such as 1.0 volts. Transistor 28 includes an emitter coupled to power supply conductor 26 and a base coupled to the base of transistor 24 to operate as a current mirror. A first collector of transistor 28 is coupled to the collector of transistor 30 and to node 18. A second collector of transistor 28 is coupled to the collector and base of diode-configured transistor 32. The base of transistor 32 is coupled to the base of transistor 30 forming a current mirror arrangement. The emitters of transistors 30 and 32 are coupled to power supply conductor 22. Transistor 34 has a base coupled to node 18, an emitter coupled to power supply conductor 22, and an open collector for providing the output signal $V_{OUT}$.

The operation of output stage 16 shown in FIG. 2 proceeds as follows. The single-ended signal at node 18 causes a current $I_{20}$ to flow through transistor 20. Transistor 20 requires a base current for bias to perform its forward current gain amplification. The current $I_{20}$ flows into the input of current mirror arrangement 24 and 28. Assuming transistors 20 and 24 each have the same emitter area 1A, transistor 28 is sized to have a 2A emitter area so that the first and second collectors of transistor 28 conduct currents $I_{28.1}=I_{28.2}=I_{20}=I_{24}$.

The current mirror arrangement 30–32 receives current $I_{28.2}$ at its input. Current $I_{28.2}$ must supply the base currents $I_B$ of transistors 30 and 32. Therefore, the collector of transistor 32 conducts $I_{28.2}-2I_B$. The emitter of transistor 32 conducts current $I_{28.2}-I_B$ after its base current sums back in. Likewise, the emitter of transistor 30 conducts current $I_{28.2}-I_B$, while its the collector conducts current $I_{28.2}-2I_B$. With the first collector of transistor 28 supplying current $I_{28.1}$ and the collector of transistor 30 conducting current $I_{28.2}-2I_B$, the $2I_B$ difference current flows into the base of transistors 20 and 34. The $2I_B$ current becomes a bias cancellation current to supply the base current needed to bias transistors 20 and 34. With the bias cancellation current $2I_B$, the single-ended signal from converter 14 need not supply the bias current requirement for transistors 20 and 34. This allows node 18 to maintain a high impedance while output stage 16 provides maximum gain and output drive even with a 1.0 volt power supply potential.

Figure 3:
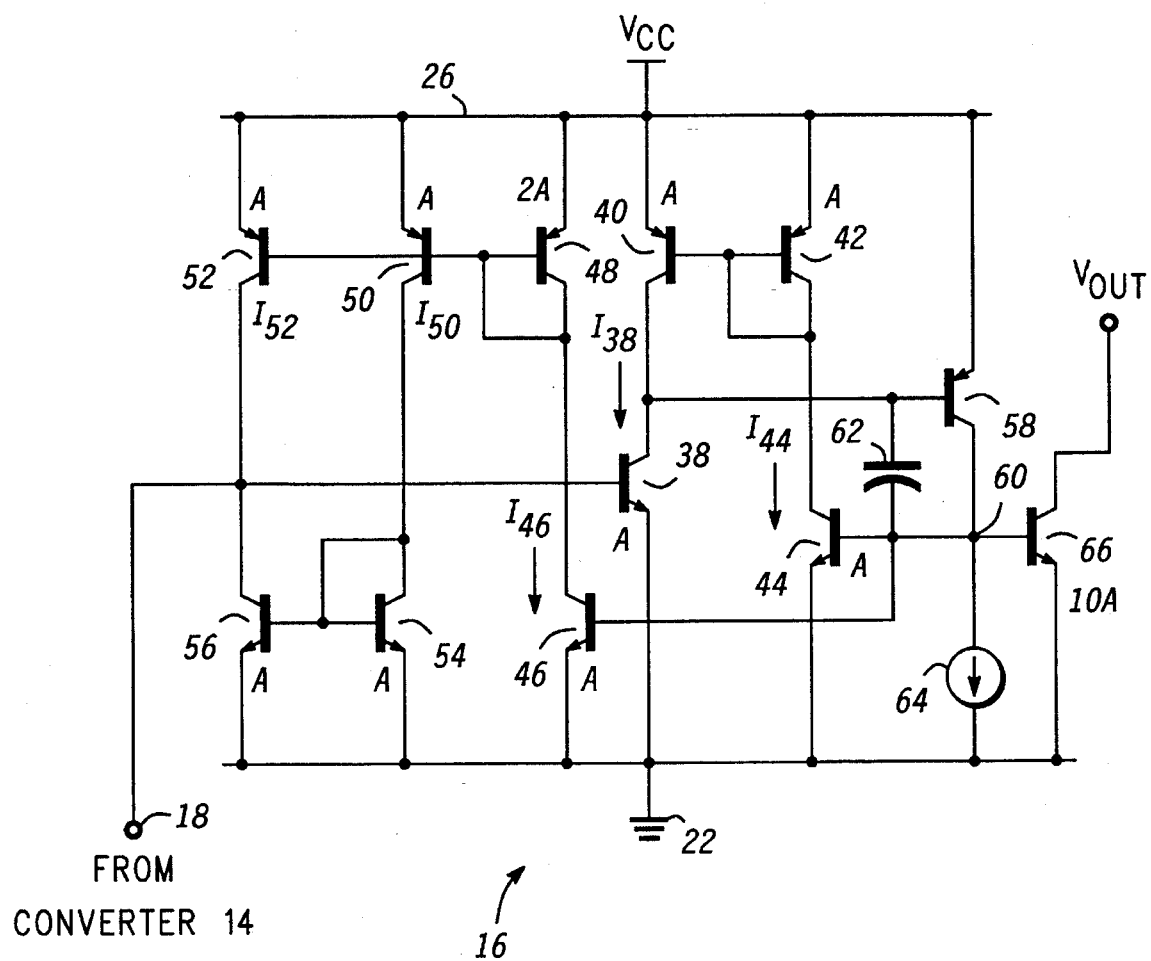
FIG. 3 is a schematic diagram illustrating an alternate embodiment of the amplifier output stage.

An alternate embodiment of output stage 16 is shown in FIG. 3 including transistor 38 having a base coupled to node 18 for receiving the single-ended signal from converter 14. The emitter of transistor 38 is coupled to power supply conductor 22. The collector of transistor 38 is coupled to the collector of transistor 40. The base of transistor 40 is coupled to the base and collector of diode-configured transistor 42 to form a current mirror. The emitters of transistors 40 and 42 are coupled to power supply conductor 26. The collector of transistor 42 is coupled to the collector of transistor 44 that includes an emitter coupled to power supply conductor 22 and a base coupled to the base of transistor 46 at node 60. The emitters of transistors 44 and 46 are coupled to power supply conductor 22. The collector of transistor 46 is coupled to the collector and base of transistor 48. Transistors 50 and 52 each include a base coupled to the base of transistor 48 for providing a current mirror operation. The emitters of transistors 48, 50, and 52 are coupled to power supply conductor 26. The collector of transistor 50 is coupled to the collector and base of transistor 54. Transistor 56 includes a base coupled to the base of transistor 54 for providing a current mirror operation, and a collector coupled to the collector of transistor 52 and to node 18. The emitters of transistors 54 and 56 are coupled to power supply conductor 22.

Output stage 16 in FIG. 3 further illustrates transistor 58 having a base coupled to the collector of transistor 38, an emitter coupled to power supply conductor 26, and a collector coupled to node 60. Capacitor 62 is coupled between node 60 and the base of transistor 58 for frequency compensation. A current source 64 is coupled between node 60 and power supply conductor 22. Transistor 66 has a base coupled to node 60, an emitter coupled to power supply conductor 22, and an open collector for providing the output signal $V_{OUT}$.

The operation of output stage 16 shown in FIG. 3 proceeds as follows. The single-ended signal at node 18 causes a current $I_{38}$ to flow in transistor 38. Transistor 38 requires a base current for bias to perform its forward current gain amplification. Transistor 38 provides base current to transistor 58 that in turn supplies the base of transistor 44. The current flowing through transistor 44 is mirrored through transistors 42 and 40 to drive the base of transistor 58 into a regulating mode. Transistor 40 supplies the $I_{38}$ collector current for transistor 38. Transistors 38, 40, 42, and 44 are sized to have equal emitter areas 1A and therefore, neglecting base currents, each conduct substantially equal currents $I_{38}=I_{40}=I_{42}=I_{44}$ as regulated by transistor 58. Thus, the single-ended signal from node 18 causes a current $I_{38}$ to flow in transistor 38 and an equal current $I_{44}$ to flow in transistor 44. Current supply 64 is selected to conduct about 1.0 microamps to enhance the frequency performance of transistor 58. Transistor 66 receives the same base signal as transistor 44 to provide the output signal $V_{OUT}$. Transistor 66 may be sized to have an emitter area 10A which is ten times that of transistor 44 and therefore conducts ten times the current through its open-collector output for more drive capacity.

The base signal for transistors 44 and 66 is also supplied to transistor 46. Transistor 46 is sized to have an emitter area 1A and conduct a current $I_{46}$ equal to current $I_{44}$. The collector of transistor 48 is the input to the current mirror arrangement 48–52. Transistor 48 has a 2A emitter area. Transistors 50 and 52 each have a 1A emitter area and therefore conduct currents $I_{50}=I_{52}\approx I_{46}/2$, neglecting base current.

The current mirror arrangement 54–56 receives current $I_{50}$ at its input. Current $I_{50}$ must supply the base currents $I_B$ of transistors 54 and 56. Therefore, the collector of transistor 54 conducts $I_{50}$-$2I_B$. The emitter of transistor 54 conducts current $I_{50}$-$I_B$ after its base current sums back in. Likewise, the emitter of transistor 56 conducts current $I_{50}$-$I_B$, while its collector conducts current $I_{50}$-$2I_B$. With the collector of transistor 52 supplying current $I_{52}$ and the collector of transistor 56 conducting current $I_{50}$-$2I_B$, that leaves the $2I_B$ difference current flowing into the base of transistor 38. Since currents $I_{50}=I_{52}\approx I_{46}/2=I_{38}/2$, the $2I_B$ current becomes a bias cancellation current to supply the base current needed to bias transistor 38. With the bias cancellation current $2I_B$, the single-ended signal from converter 14 need not supply the bias current requirement for transistor 38. This allows node 18 to maintain a high impedance while output stage 16 provides maximum gain and output drive even with a 1.0 volt power supply potential.

By now it should be appreciated that the present invention generates a bias cancellation current to the base of the input transistors to the amplifier output stage. With the bias cancellation current, the single-ended signal need not supply the bias current requirement for the input transistor. The cancellation current maintains high impedance looking into the output stage to provide high gain and drive capability.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:

a first transistor having a base, a collector and an emitter, said base being coupled to an input of the circuit, said emitter being coupled to a first power supply conductor;

a first current mirror circuit having an input coupled to said collector of said first transistor;

a second current mirror circuit having an input and an output, said output being coupled to a first output of said first current mirror circuit and to said input of the circuit, said input being coupled to a second output of said first current mirror circuit; and a second transistor having a base, a collector and an emitter, said base being coupled to said input of the circuit, said emitter being coupled to said first power supply conductor, said collector providing an output signal of the circuit.

2. The circuit of claim 1 wherein said first current mirror circuit includes:

a third transistor having a base, a collector and an emitter, said base and collector being coupled together to said collector of said first transistor, said emitter being coupled to a second power supply conductor; and a fourth transistor having a base, first and second collectors and an emitter, said base being coupled to said base and said collector of said third transistor, said emitter being coupled to said second power supply conductor, said first collector being coupled to said output of said second current mirror circuit and to said input of the circuit, said second collector being coupled to said input of said second current mirror circuit.

3. The circuit of claim 1 wherein said second current mirror circuit includes:

a third transistor having a base, a collector and an emitter, said base and collector being coupled together to said second output of said first current mirror circuit, said emitter being coupled to said first power supply conductor; and a fourth transistor having a base, a collector and an emitter, said base being coupled to said base and said collector of said third transistor, said emitter being coupled to said first power supply conductor, said collector being coupled to said first output of said first current mirror circuit and to said input of the circuit.

4. An amplifier output stage, comprising:

a first transistor having a base, a collector and an emitter, said base being coupled to an input of the amplifier output stage, said emitter being coupled to a first power supply conductor;

a first current mirror circuit having an output coupled to said collector of said first transistor;

a second transistor having a base, a collector and an emitter, said collector being coupled to an input of said first current mirror circuit, said emitter being coupled to said first power supply conductor;

a third transistor having a base, a collector and an emitter, said base being coupled to said collector of said first transistor, said emitter being coupled to a second power supply conductor, said collector being coupled to said base of said second transistor at a first node;

a fourth transistor having a base, a collector and an emitter, said base being coupled to said first node, said emitter being coupled to said first power supply conductor;

a second current mirror circuit having an input coupled to said collector of said fourth transistor; and a third current mirror circuit having an input coupled to a first output of said second current mirror circuit and having an output coupled to a second output of said second current mirror circuit and to said input of the amplifier output stage.

5. The amplifier output stage of claim 4 further including a fifth transistor having a base, a collector and an emitter, said base being coupled to said first node, said emitter being coupled to said first power supply conductor, said collector providing an output signal of the amplifier output stage.

6. The amplifier output stage of claim 5 further including:

a current source coupled between said first node and said first power supply conductor; and a capacitor coupled between said first node and said base of said third transistor.

7. The amplifier output stage of claim 4 wherein said first current mirror circuit includes:

a fifth transistor having a base, a collector and an emitter, said base and collector being coupled together to said collector of said second transistor, said emitter being coupled to said second power supply conductor; and a sixth transistor having a base, a collector and an emitter, said base being coupled to said base and said collector of said fifth transistor, said emitter being coupled to said second power supply conductor, said collector being coupled to said collector of said first transistor.

8. The amplifier output stage of claim 4 wherein said second current mirror circuit includes:

a fifth transistor having a base, a collector and an emitter, said base and collector being coupled together to said collector of said fourth transistor, said emitter being coupled to said second power supply conductor;

a sixth transistor having a base, a collector and an emitter, said base being coupled to said base and said collector of said fifth transistor, said emitter being coupled to said second power supply conductor, said collector being coupled to said input of said third current mirror circuit; and a seventh transistor having a base, a collector and an emitter, said base being coupled to said base and said collector of said fifth transistor, said emitter being coupled to said second power supply conductor, said collector being coupled to said output of said third current mirror circuit and to said input of the amplifier output stage.

9. The amplifier output stage of claim 4 wherein said third current mirror circuit includes:

a fifth transistor having a base, a collector and an emitter, said base and collector being coupled together to said first output of said second current mirror circuit, said emitter being coupled to said first power supply conductor; and a sixth transistor having a base, a collector and an emitter, said base being coupled to said base and said collector of said fifth transistor, said emitter being coupled to said first power supply conductor, said collector being coupled to said second output of said second current mirror circuit and to said input of the amplifier output stage.

10. An amplifier circuit, comprising:

a differential input stage having first and second inputs coupled for receiving a differential input signal and having first and second outputs for providing an amplified differential signal;

a converter circuit having first and second inputs coupled for receiving said amplified differential signal and having an output for providing a single-ended signal; and an output stage having an input coupled for receiving said single-ended signal and having an output for providing an output signal of the amplifier circuit, said output stage including, (a) a first transistor having a base, a collector and an emitter, said base being coupled to said input of said output stage, said emitter being coupled to a first power supply conductor, (b) a first current mirror circuit having an input coupled to said collector of said first transistor, (c) a second current mirror circuit having an input and an output, said output being coupled to a first output of said first current mirror circuit and to said input of said output stage, said input being coupled to a second output of said first current mirror circuit, and (d) a second transistor having a base, a collector and an emitter, said base being coupled to said input of said output stage, said emitter being coupled to said first power supply conductor, said collector providing the output signal of the amplifier circuit.

11. The amplifier circuit of claim 10 wherein said first current mirror circuit includes:

a third transistor having a base, a collector and an emitter, said base and collector being coupled together to said collector of said first transistor, said emitter being coupled to a second power supply conductor; and a fourth transistor having a base, first and second collectors and an emitter, said base being coupled to said base and said collector of said third transistor, said emitter being coupled to said second power supply conductor, said first collector being coupled to said output of said second current mirror circuit and to said input of said output stage, said second collector being coupled to said input of said second current mirror circuit.

12. The amplifier circuit of claim 10 wherein said second current mirror circuit includes:

a third transistor having a base, a collector and an emitter, said base and collector being coupled together to said second output of said first current mirror circuit, said emitter being coupled to said first power supply conductor; and a fourth transistor having a base, a collector and an emitter, said base being coupled to said base and said collector of said third transistor, said emitter being coupled to said first power supply conductor, said collector being coupled to said first output of said first current mirror circuit and to said input of said output stage.

13. An amplifier circuit, comprising:
- a differential input stage having first and second inputs coupled for receiving a differential input signal and having first and second outputs for providing an amplified differential signal;
- a converter circuit having first and second inputs coupled for receiving said amplified differential signal and having an output for providing a single-ended signal; and
- an output stage having an input coupled for receiving said single-ended signal and having an output for providing an output signal of the amplifier circuit, said output stage including,
  - (a) a first transistor having a base, a collector and an emitter, said base being coupled to said input of said output stage, said emitter being coupled to a first power supply conductor,
  - (b) a first current mirror circuit having an input and having an output coupled to said collector of said first transistor,
  - (c) a second transistor having a base, a collector and an emitter, said collector being coupled to said input of said first current mirror circuit, said emitter being coupled to said first power supply conductor,
  - (d) a third transistor having a base, a collector and an emitter, said based being coupled to said collector of said first transistor, said emitter being coupled to a second power supply conductor, said collector being coupled to said base of said second transistor at a first node,
  - (e) a fourth transistor having a base, a collector and an emitter, said base being coupled to said first node, said emitter being coupled to said first power supply conductor,
  - (f) a second current mirror circuit having an input coupled to said collector of said fourth transistor, and
  - (g) a third current mirror circuit having an input coupled to a first output of said second current mirror circuit and having an output coupled to a second output of said second current mirror circuit and to said input of said output stage.

14. The amplifier circuit of claim 13 wherein said output stage further includes:
- a fifth transistor having a base, a collector and an emitter, said base being coupled to said first node, said emitter being coupled to said first power supply conductor, said collector providing an output signal of the amplifier circuit;
- a current source coupled between said first node and said first power supply conductor; and
- a capacitor coupled between said first node and said base of said third transistor.

15. The amplifier circuit of claim 13 wherein said first current mirror circuit includes:
- a fifth transistor having a base, a collector and an emitter, said base and collector being coupled together to said collector of said second transistor, said emitter being coupled to said second power supply conductor; and
- a sixth transistor having a base, a collector and an emitter, said base being coupled to said base and said collector of said fifth transistor, said emitter being coupled to said second power supply conductor, said collector being coupled to said collector of said first transistor.

16. The amplifier circuit of claim 13 wherein said second current mirror circuit includes:
- a fifth transistor having a base, a collector and an emitter, said base and collector being coupled together to said collector of said fourth transistor, said emitter being coupled to said second power supply conductor;
- a sixth transistor having a base, a collector and an emitter, said base being coupled to said base and said collector of said fifth transistor, said emitter being coupled to said second power supply conductor, said collector being coupled to said input of said third current mirror circuit; and
- a seventh transistor having a base, a collector and an emitter, said base being coupled to said base and said collector of said fifth transistor, said emitter being coupled to said second power supply conductor, said collector being coupled to said output of said third current mirror circuit and to said input of said output stage.

17. The amplifier circuit of claim 13 wherein said third current mirror circuit includes:
- a fifth transistor having a base, a collector and an emitter, said base and collector being coupled together to said first output of said second current mirror circuit, said emitter being coupled to said first power supply conductor; and
- a sixth transistor having a base, a collector and an emitter, said base being coupled to said base and said collector of said fifth transistor, said emitter being coupled to said first power supply conductor, said collector being coupled to said second output of said second current mirror circuit and to said input of said output stage.

* * * * *